United States Patent
Francisco et al.

(10) Patent No.: US 10,404,015 B2
(45) Date of Patent: Sep. 3, 2019

(54) ELECTRIC CONNECTOR WITH MOUNTING SURFACE

(71) Applicants: Tyco Electronics Componentes Electromecanicos Lda., Evora (PT); TE Connectivity Germany GmbH, Bensheim (DE)

(72) Inventors: Herlander M. Francisco, Maceira (PT); Joerg Einhorn, Berlin (DE); Mathias Michael, St. Leon-Rot (DE); Georges Romain Ngongang, Longeville les Metz (FR)

(73) Assignees: Tyco Electronics Componentes Electromecanicos Lda., Evora (PT); TE Connectivity Germany GmbH, Bensheim (DE)

( * ) Notice: Subject to any disclaimer, the term of this patent is extended or adjusted under 35 U.S.C. 154(b) by 0 days.

(21) Appl. No.: 15/622,537

(22) Filed: Jun. 14, 2017

(65) Prior Publication Data
US 2017/0365957 A1    Dec. 21, 2017

(30) Foreign Application Priority Data
Jun. 17, 2016   (EP) ..................... 16398006

(51) Int. Cl.
*H01R 13/66* (2006.01)
*H01R 31/00* (2006.01)
(Continued)

(52) U.S. Cl.
CPC ....... *H01R 13/665* (2013.01); *H01R 13/6658* (2013.01); *H01R 31/00* (2013.01);
(Continued)

(58) Field of Classification Search
CPC .... H01R 13/6658; H01R 24/62; H01R 24/64; H01R 13/6466; H01R 13/6464
(Continued)

(56) References Cited

U.S. PATENT DOCUMENTS

| | | | | |
|---|---|---|---|---|
| 5,281,155 A | * | 1/1994 | Comerci | H01R 13/6666 361/212 |
| 7,153,158 B1 | * | 12/2006 | Lee | H01R 13/6658 439/541.5 |
| 7,314,387 B1 | * | 1/2008 | Liu | H01R 13/6633 439/620.11 |
| 2005/0181643 A1 | * | 8/2005 | Brower | H04L 67/02 439/76.1 |
| 2014/0113501 A1 | * | 4/2014 | Schoenfeld | H01R 12/714 439/700 |

(Continued)

FOREIGN PATENT DOCUMENTS

DE    3345701 A1    6/1985
EP    0113238 A2    12/1983
(Continued)

OTHER PUBLICATIONS

Extended European Search Report, dated Nov. 29, 2016, 7 pages.
(Continued)

*Primary Examiner* — Abdullah A Riyami
*Assistant Examiner* — Justin M Kratt
(74) *Attorney, Agent, or Firm* — Barley Snyder

(57) ABSTRACT

An electric connector comprises a contact, a base assembly, a pair of first circuit board sections, and a plurality of electric components. The base assembly has a connector face on a first side and an interior side opposite to the connector face. The contact is disposed on the connector face. The pair of first circuit board sections are disposed on the interior side and extend away from the base assembly. The pair of first circuit board sections face each other. At least one electric component is disposed on each of the first circuit board sections.

23 Claims, 4 Drawing Sheets

(51) Int. Cl.
  *H05K 1/14* (2006.01)
  *H05K 7/14* (2006.01)
  *H01R 24/62* (2011.01)
  *H01R 13/6466* (2011.01)
  *H01R 13/6464* (2011.01)
  *H01R 24/64* (2011.01)
  *H05K 1/18* (2006.01)
  *H01R 13/05* (2006.01)

(52) U.S. Cl.
  CPC ............ *H05K 1/14* (2013.01); *H05K 7/1417* (2013.01); *H01R 13/055* (2013.01); *H01R 13/6464* (2013.01); *H01R 13/6466* (2013.01); *H01R 24/62* (2013.01); *H01R 24/64* (2013.01); *H01R 2201/26* (2013.01); *H05K 1/181* (2013.01); *H05K 2201/047* (2013.01); *H05K 2201/048* (2013.01); *H05K 2201/10522* (2013.01)

(58) Field of Classification Search
  USPC ................. 439/620.22, 676, 620.11
  See application file for complete search history.

(56) References Cited

U.S. PATENT DOCUMENTS

| | | | | |
|---|---|---|---|---|
| 2014/0308853 | A1* | 10/2014 | Colahan | H01R 13/6675 439/628 |
| 2014/0335714 | A1* | 11/2014 | Schrader | H01R 12/772 439/329 |
| 2015/0092426 | A1* | 4/2015 | Brink | F21V 23/00 362/382 |

FOREIGN PATENT DOCUMENTS

| | | |
|---|---|---|
| EP | 1841303 A2 | 10/2007 |
| WO | 2013055948 A2 | 4/2013 |

OTHER PUBLICATIONS

Abstract of DE3345701, dated Jun. 27, 1985, 2 pages.
European Communication, European Patent Application No. 16 398 0063, dated Feb. 5, 2019, 8 pages.

* cited by examiner

ELECTRIC CONNECTOR WITH MOUNTING SURFACE

CROSS-REFERENCE TO RELATED APPLICATION

This application claims the benefit of the filing date under 35 U.S.C. § 119(a)-(d) of European Patent Application No. 16398006.3, filed on Jun. 17, 2016.

FIELD OF THE INVENTION

The present invention relates to an electric connector and, more particularly, to an electric connector receiving electric components on a mounting surface.

BACKGROUND

Electric connectors used in automotive applications are known in the art. These electric connectors are available with standardized sizes and connection types. A plug face of an electric automotive connector, for example, has a standardized arrangement of contact pins, flat connectors, or soldering pins. As modern automobiles add new functions, the associated increased complexity puts a strain on an electric circuit included in the various connectors.

SUMMARY

An object of the invention, among others, is to provide an electric connector having an increased space for receiving electric components without increasing a size of the electric connector. An electric connector according to the invention comprises a contact, a base assembly, a pair of first circuit board sections, and a plurality of electric components. The base assembly has a connector face on a first side and an interior side opposite to the connector face. The contact is disposed on the connector face. The pair of first circuit board sections are disposed on the interior side and extend away from the base assembly. The pair of first circuit board sections face each other. At least one electric component is disposed on each of the first circuit board sections.

BRIEF DESCRIPTION OF THE DRAWINGS

The invention will now be described by way of example with reference to the accompanying Figures, of which.

DETAILED DESCRIPTION OF THE EMBODIMENTS

Figure 1:
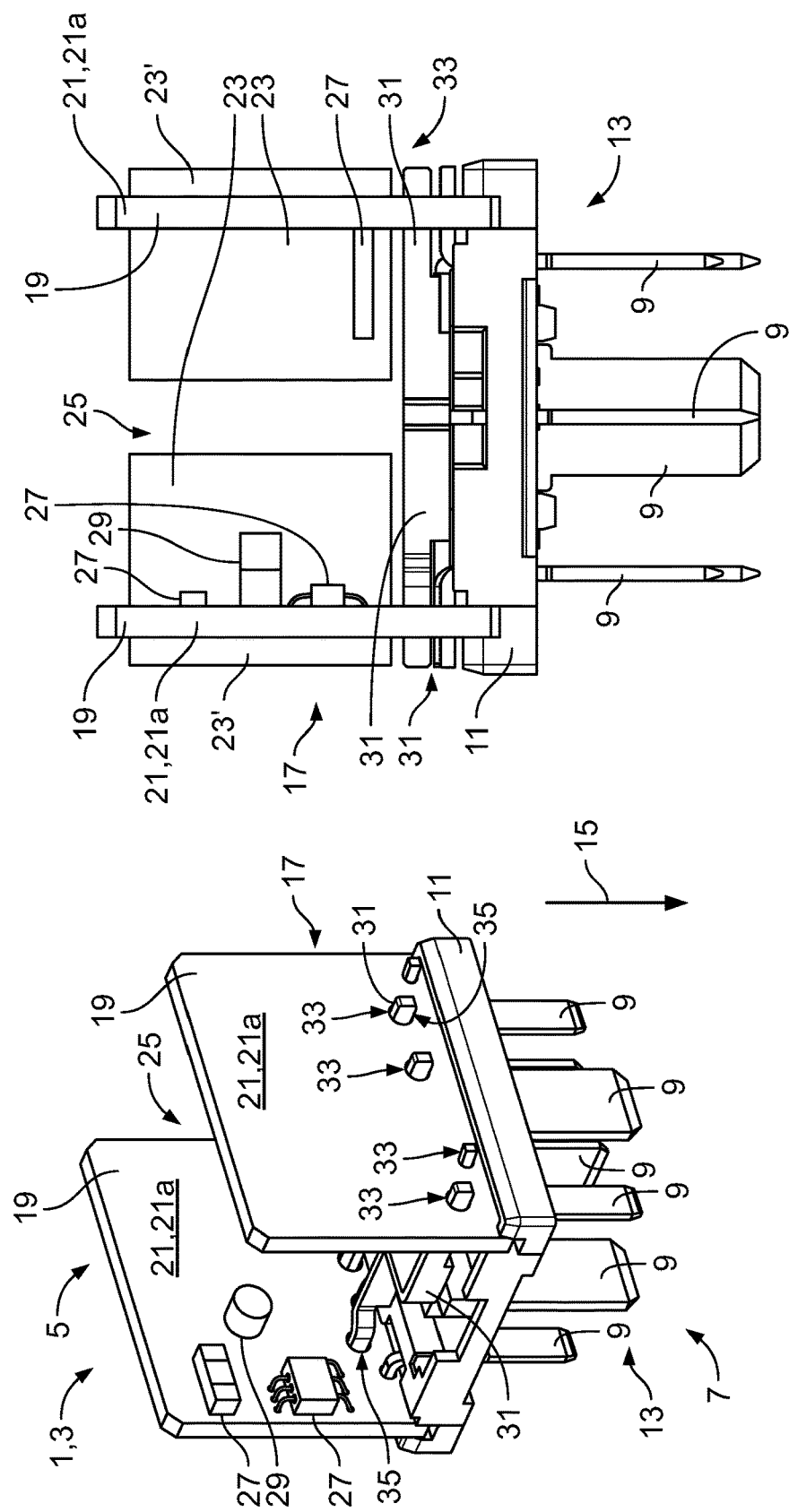
FIG. 1 is a perspective view and a side view of an electric connector according to the invention.

Embodiments of the present invention will be described hereinafter in detail with reference to the attached drawings, wherein like reference numerals refer to the like elements. The present invention may, however, be embodied in many different forms and should not be construed as being limited to the embodiments set forth herein; rather, these embodiments are provided so that the disclosure will be thorough and complete, and will fully convey the concept of the invention to those skilled in the art.

An electric connector 1 according to an embodiment of the present invention is shown in FIG. 1. In the shown embodiment, the connector 1 is a relay 3 in a plug-in form 5. The plug-in form 5 has a connector face 7 including a plurality of contacts 9. The connector 1 may be an automotive electric connector.

The connector 1, as shown in FIG. 1, has a base assembly 11 receiving the contacts 9. The contacts 9 extend from the base assembly 11 to a connector side 13 in an insertion direction 15. Along the insertion direction 15, the connector 1 may be plugged into a corresponding plug socket disposed, for example, in a car.

Opposite to the connector face 7, as shown in FIG. 1, the connector 1 has an interior side 17 on which two first circuit board sections 19 are disposed extending away from the base assembly 11. The two first circuit board sections 19 are oriented essentially perpendicular to the base assembly 11 and parallel to each other. The two first circuit board sections 19 are each a first circuit board 21; in the embodiment shown in FIG. 1, the first circuit boards 21 are each an individual first circuit board 21a.

Each of the individual first circuit boards 21a has a first mounting volume 23 with a mounting surface, shown schematically in FIG. 1, facing towards a space 25 between the first circuit boards 21 and a second mounting volume 23' with a mounting surface which faces away from said space 25. Within the first mounting volumes 23, each of the first circuit board sections 19 has at least one electric component 27. In the embodiment shown in FIG. 1, one of the first mounting volumes 23 has two electric components 27. In the shown embodiment, the connector 1 also has mechanical or electromechanical components 29. By providing two first circuit board sections 19, the mounting surface of the mounting volumes 23, 23' may be increased up to twice the value of a single circuit board section. One of the first circuit boards 21 can compensate for the other first circuit board 21 in case of a failure. Further, having each circuit board section 19, as an individual circuit board 21a facilitates maintenance, as the individual circuit boards 21a can be replaced.

The connector 1, as shown in FIG. 1, has transmitting elements 31 disposed and/or attached to the interior side 17 of the base assembly 11 and which are either connected to or monolithically formed with the contacts 9. The transmitting elements 31 are mechanically and electrically connected to the individual first circuit boards 21a via passageways 33; the transmitting elements 31 are inserted through holes 35 in the individual first circuit boards 21a and subsequently soldered to the individual first circuit boards 21a. The transmitting elements 31 transmit electric signals and/or power supply voltages from the contacts 9 to the electric components 27 or electromechanical components 29 arranged on the individual first circuit boards 21a.

In another embodiment, an insulating element may connect the two first circuit board sections 19 to increase the mechanical stability of each of the circuit board sections 19.

Figure 2:
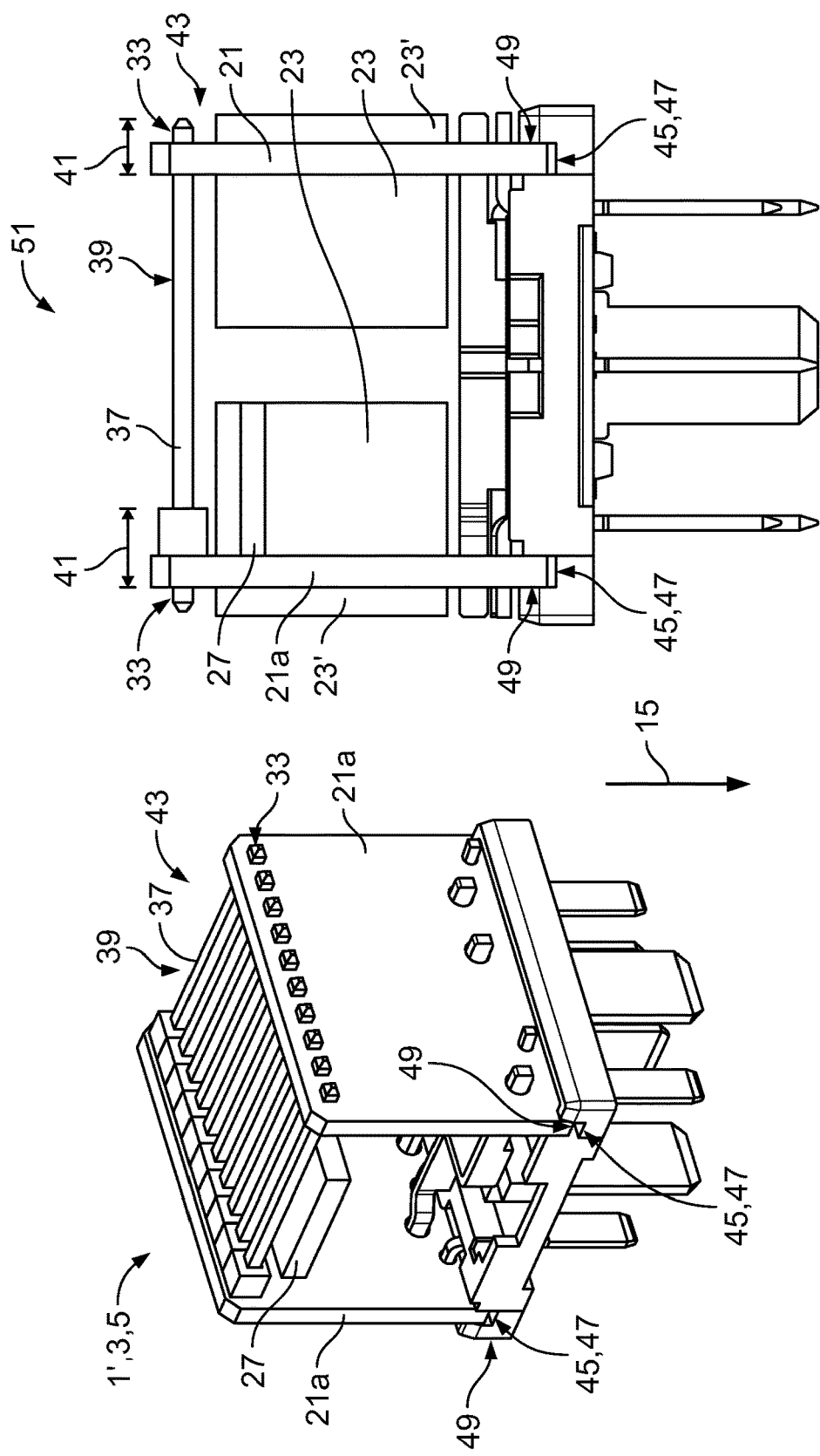
FIG. 2 is a perspective view and a side view of another electric connector according to the invention.

An electric connector 1' according to another embodiment of the present invention is shown in FIG. 2. In the shown embodiment, the connector 1' is a relay 3 in a plug-in form 5. The electric connector 1' is similar to the electric connector 1 shown in FIG. 1, wherein like reference numerals indicate like elements. Only the differences of the electric connector 1' with respect to the electric connector 1 will be described in detail herein.

The electric connector 1', as shown in FIG. 2, has a plurality of electrically conductive rods 37 connecting the two individual first circuit boards 21*a*. The electrically conductive rods 37 are attached to the individual first circuit boards 21*a* via passageways 33. The individual first circuit boards 21*a* and the electrically conductive rods 37 are arranged in a U-shape 43. The U-shape 43 provides increased stability and resistance to vibrations. An established electric connection 39 allows for transmission of electrically coded data and/or supply voltages from one individual first circuit board 21*a* to another individual first circuit board 21*a*. The electrically conductive rods 37 also mechanically stabilize the individual first circuit boards 21*a* by preventing or at least reducing vibrations of the individual first circuit boards 21*a* along a vibration direction 41.

The two individual first circuit boards 21*a* are received in a form-fit member 45 disposed on the interior side 17 of the base assembly 11. In the embodiment shown in FIG. 2, the form-fit member 45 is a groove 47. The two individual first circuit boards 21*a* are partially received within two grooves 47 opening towards the interior side 17 such that each groove 47 engages in a form-fit 49 with the corresponding individual first circuit board 21*a*. The individual first circuit boards 21*a* may be loosely received in the grooves 47, may be press-fit into the grooves 47, or may be mechanically clamped or fixed to the groove 47 by an appropriate fastener such as a screw.

The connector 1' shown in FIG. 2 has first mounting volumes 23 and second mounting volumes 23'. As shown in FIG. 2, a dimension of the first mounting volumes 23 and the second mounting volumes 23' in a direction opposite to the insertion direction 15 is slightly reduced by the presence of the electrically conductive rods 37. The electrically conductive rods 37, however, may protect electric components 27 from being accessed from an upper side 51.

Figure 3:
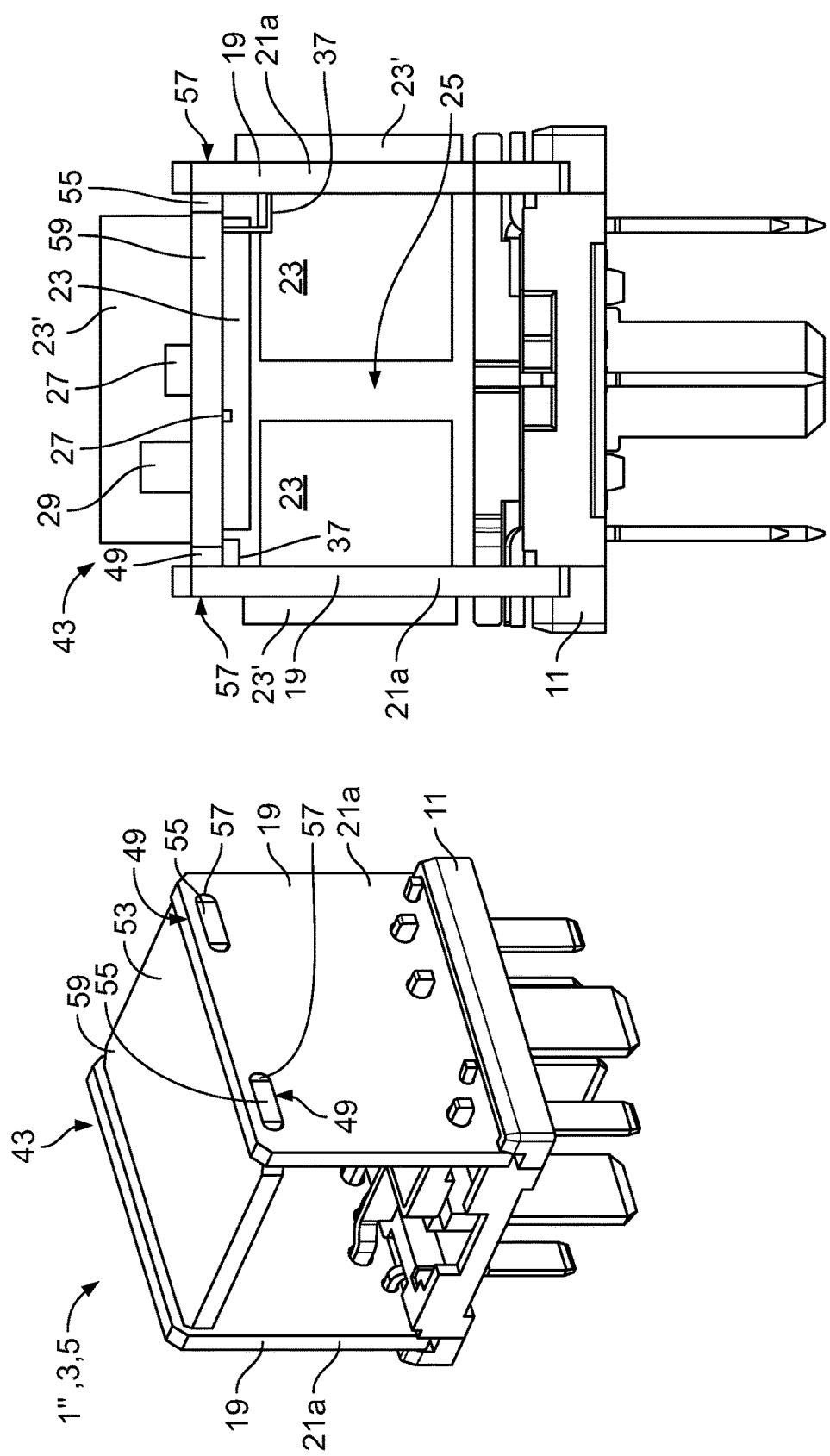
FIG. 3 is a perspective view and a side view of another electric connector according to the invention.

An electric connector 1" according to another embodiment of the present invention is shown in FIG. 3. In the shown embodiment, the connector 1" is a relay 3 in a plug-in form 5. The electric connector 1" is similar to the electric connector 1 shown in FIG. 1, wherein like reference numerals indicate like elements. Only the differences of the electric connector 1" with respect to the electric connector 1 will be described in detail herein.

The electric connector 1" has a second circuit board section 53 which is attached to the two first circuit board sections 19 by four bearing members 55. The first circuit boards 21*a* and the second circuit board 59 form a U-shape 43. The bearing members 55 extend away from the second circuit board section 53 and are received in bearing receptacles 57 embodied in the two individual first circuit boards 21*a* at a side thereof distal to the base assembly 11. The bearing receptacles 57 and the bearing members 55 engage with each other in a form-fit 49; the bearing members 55 abut the interior of the bearing receptacles 57, which detachably receive the bearing members 55. The bearing members 55 and the bearing receptacles 57 are essentially complementary to each other. As shown in FIG. 3, the bearing members 55 do not extend in the space 25 or out of the bearing receptacles 57 of the individual first circuit boards 21*a*.

The second circuit board section 53, as shown in FIG. 3, is a second circuit board 59 which is oriented essentially perpendicular to the individual first circuit boards 21*a* and essentially parallel to the base assembly 11. The second circuit board 59 defines additional mounting volumes 23, 23' in which further electric 27 or electromagnetic components 29 may be mounted to the second circuit board 59. The second circuit board 59 is electrically connected to at least one of the individual first circuit boards 21*a* by an angled electrically conductive element 37.

Figure 4:
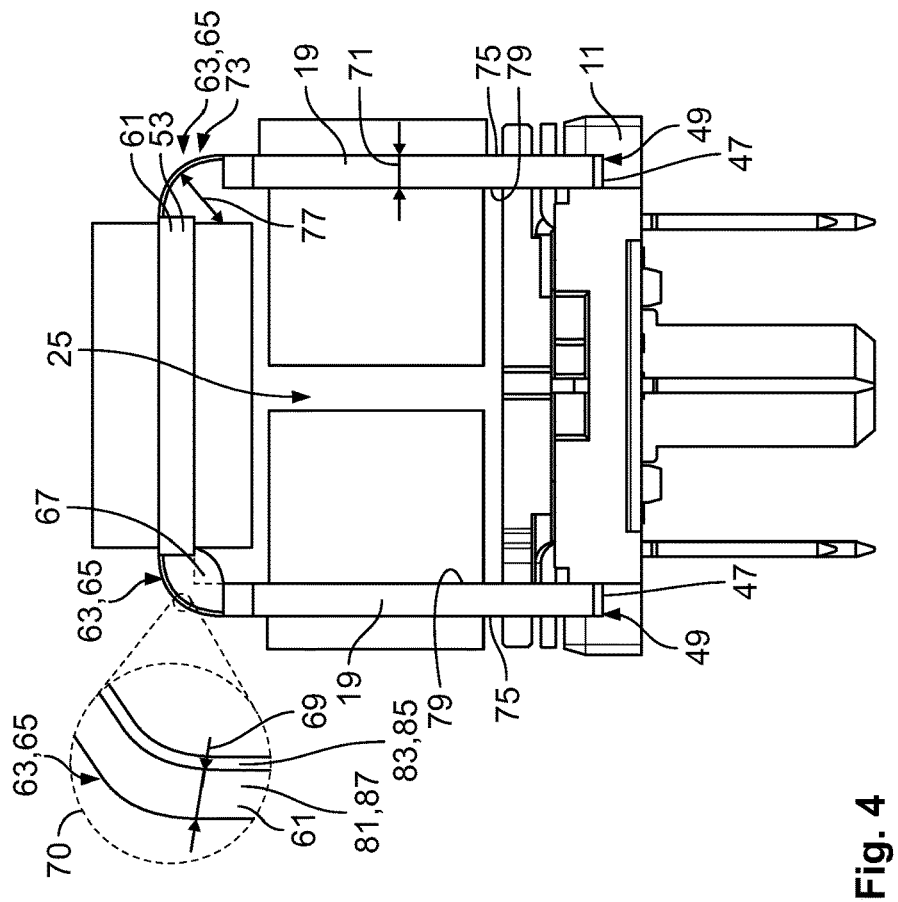
FIG. 4 is a perspective view and a side view of another electric connector according to the invention.
Figure 4:
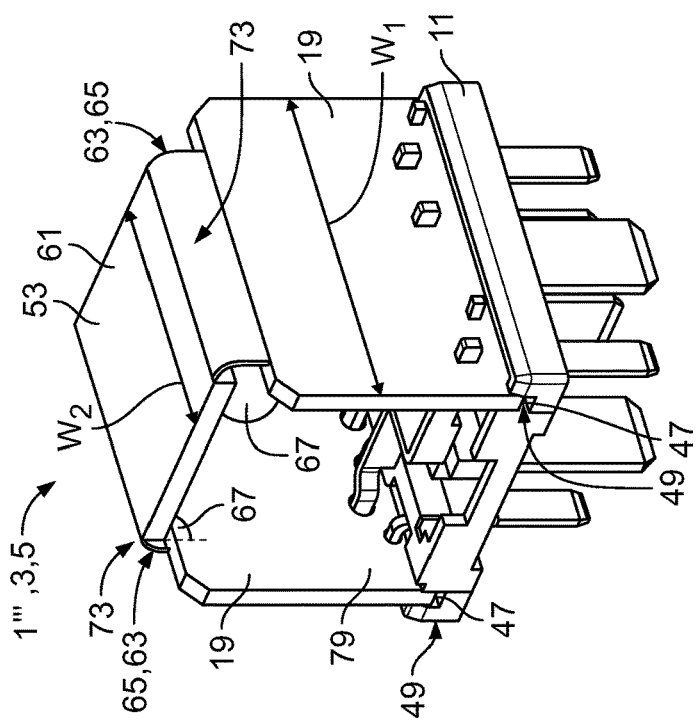

An electric connector 1''' according to another embodiment of the present invention is shown in FIG. 4. In the shown embodiment, the connector 1''' is a relay 3 in a plug-in form 5. The electric connector 1''' is similar to the electric connector 1 shown in FIG. 1, wherein like reference numerals indicate like elements. Only the differences of the electric connector 1''' with respect to the electric connector 1 will be described in detail herein.

Contrary to the first three embodiments, the connector 1''' does not have individual first circuit boards 21*a* but is formed by a monolithic circuit board 61. The monolithic circuit board 61 has two first circuit board sections 19 which are essentially oriented perpendicular to the base assembly 11 and essentially parallel to each other, and a second circuit board section 53 which is essentially oriented perpendicular to the two first circuit board sections 19 and essentially parallel to the base assembly 11. The ends of the monolithic circuit board 61 are received in the grooves 47 of the base assembly 11 and are engaged in a form-fit 49 therewith. An angled section 63 of the monolithic circuit board 61 is disposed between each of the two first circuit board sections 19 and the second circuit board section 53.

As shown in FIG. 4, the first circuit board sections 19 have a width w1 which is larger than a width w2 of the second circuit board section 53. The angled sections 63 extend along the second circuit board section 53 have the same width w2. In the embodiment shown in FIG. 4, the angled sections 63 are bent sections 65. In other embodiments, the angled sections 63 may be folded sections. The bent sections 65 result in a bending angle 67 between each of the two first circuit board sections 19 and the second circuit board section 53. The bending angle 67 is approximately a right angle of 90°.

The angled sections 63, as shown in FIG. 4, have a decreased thickness 69 (shown in zoom 70), which is smaller than a circuit board thickness 71. This decreased thickness 69 results in an increased flexibility 73 of the angled sections 63. The angled sections 63 are located at outer walls 75 of the connector 1''' facing away from the space 25 in between the first circuit board sections 19 and the second circuit board section 53. This solution has the advantage that a bending radius 77 of the angled sections 63 is larger than it would be if the angled sections 63 were located at inner walls 79 of the connector 1'''. An increased bending radius 77 reduces the risk of fractures and/or severe damage to the angled sections 63.

As shown in the zoom 70 of FIG. 4, in the decreased thickness 69 portion of the angled section 63, the monolithic circuit board 61 is thinned such that a metallic layer 81 and a residual layer 83 of circuit board material 85 remain. In the shown embodiment, the metallic layer 81 is a copper layer 87. Reducing the decreased thickness 69 may be achieved by cutting the monolithic circuit board 61, chemically etching, or by shape cutting the angled section 63.

Although an electric component 27 is only shown in FIGS. 1 and 2, electric components 27 may similarly be attached to the connectors 1" and 1''' of FIGS. 3 and 4.

The entire electric connector 1, 1', 1", 1''' may be disposed in a known connector housing. The footprint of the connectors 1, 1', 1", 1''' is defined by an according standard; in the shown embodiments, the exemplary standard is the mini-ISO plug-in type standard for automotive relays 3. The arrangement and size of the contacts 9 may be found in the German DIN standard DIN 72552.

What is claimed is:

1. An electric connector, comprising:
   a contact;
   a base assembly having a connector face on a first side and an interior side opposite to the connector face, the contact disposed on the connector face;
   a pair of first circuit board sections each form-fit in a separate groove on the interior side and extending away from the base assembly, the pair of first circuit board sections facing each other;
   a plurality of electric components, at least one electric component disposed on each of the first circuit board sections; and
   a transmitting element disposed on the interior side of the base assembly and extending between the pair of first circuit board sections and through a passageway in each of the pair of first circuit board sections, the transmitting element electrically connected to the pair of first circuit board sections and the contact.

2. The electric connector of claim 1, wherein the contact is accessible from the connector face.

3. The electric connector of claim 1, further comprising an electrically conductive rod connecting the pair of first circuit board sections.

4. The electric connector of claim 3, wherein the electrically conductive rod is substantially parallel to the base assembly.

5. The electric connector of claim 3, wherein the pair of first circuit board sections and the electrically conductive rod form a U-shape.

6. The electric connector of claim 1, further comprising a second circuit board section disposed essentially perpendicular to the pair of first circuit board sections.

7. The electric connector of claim 6, wherein the second circuit board section and the pair of first circuit board sections form a U-shape.

8. The electric connector of claim 1, wherein each of the pair of first circuit board sections is an individual circuit board.

9. The electric connector of claim 6, wherein the second circuit board section has a bearing member.

10. The electric connector of claim 9, wherein at least one of the pair of first circuit board sections has a bearing receptacle complementary to the bearing member.

11. The electric connector of claim 10, wherein the bearing member engages the bearing receptacle in a form-fit.

12. The electric connector of claim 1, wherein each of the pair of first circuit board sections is part of a monolithic circuit board.

13. The electric connector of claim 12, wherein the monolithic circuit board has an angled section.

14. The electric connector of claim 13, wherein the angled section is a bent section or a folded section.

15. The electric connector of claim 13, wherein the angled section has a decreased thickness less than a thickness of each of the pair of first circuit board sections.

16. The electric connector of claim 15, wherein, in a portion of the angled section having the decreased thickness, the monolithic circuit board consists essentially of a metallic layer.

17. The electric connector of claim 12, wherein the monolithic circuit board has a second circuit board section disposed essentially perpendicular to the pair of first circuit board sections.

18. The electric connector of claim 1, wherein the electric connector is an automotive electric connector.

19. The electric connector of claim 1, wherein the electric connector is a mini-ISO plug connector.

20. The electric connector of claim 1, wherein each of the first circuit board sections is disposed along an exterior edge of the base assembly.

21. The electric connector of claim 1, wherein each of the first circuit board sections has a side exposed to an area exterior of the electric connector.

22. The electric connector of claim 3, wherein the electrically conductive rod has a first end attached to one of the pair of first circuit board sections and a second end attached to the other of the pair of first circuit board sections.

23. The electric connector of claim 22, wherein each of the first end and the second end of the electrically conductive rod is disposed in a passageway extending through one of the pair of first circuit board sections.

* * * * *